(12) United States Patent
Shin et al.

(10) Patent No.: US 6,720,579 B2
(45) Date of Patent: Apr. 13, 2004

(54) SEMICONDUCTOR DEVICE AND METHOD OF MANUFACTURING THE SAME

(75) Inventors: You-Cheol Shin, Kyunggi-do (KR); Kyu-Charn Park, Kyunggi-do (KR); Won-Hong Lee, Kyunggi-do (KR); Jung-Dal Choi, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/041,732

(22) Filed: Jan. 7, 2002

(65) Prior Publication Data

US 2002/0088976 A1 Jul. 11, 2002

(30) Foreign Application Priority Data

Jan. 11, 2001 (KR) .......................................... 2001-1613

(51) Int. Cl.[7] ............................................. H01L 27/108
(52) U.S. Cl. .......................... 257/68; 257/315; 438/128; 438/240; 438/257; 365/185.11; 365/185.33
(58) Field of Search ........................... 257/315; 438/257, 438/128, 240; 365/185.11, 185.33

(56) References Cited

U.S. PATENT DOCUMENTS 6,376,876 B1 * 4/2002 Shin et al. .................. 257/315

* cited by examiner

*Primary Examiner*—Son L. Mai
*Assistant Examiner*—Mai-Huong Tran
(74) *Attorney, Agent, or Firm*—Marger Johnson & McCollom, P.C.

(57) ABSTRACT

A semiconductor device comprises a plurality of gate lines composed of line shapes to function as gate electrodes in a plurality of transistors and separated from a substrate by a gate insulating layer, each having an upper metal silicide layer; and a plurality of source/drain regions formed on the substrate between said gate lines solely by carrying out impurity implantation processes.

11 Claims, 13 Drawing Sheets

SEMICONDUCTOR DEVICE AND METHOD OF MANUFACTURING THE SAME

This application relies for priority upon Korean Patent Application No. 2001-1613, filed on Jan. 11, 2001, the contents of which are herein incorporated by reference in their entirety.

FIELD OF THE INVENTION

The present invention relates to a semiconductor device and method of manufacturing the same, and more particularly to a semiconductor device and method of manufacturing the same, which has elongated wiring of silicon material such as gate lines formed to cross with an active region in a cell area.

BACKGROUND OF THE INVENTION

In a flash memory device or a dynamic random access memory (DRAM) device, gate lines generally have elongated line shapes. Also, the gate lines are formed of silicon material having conductivity lower than that of metal material. Thus, voltages at portions, for example middle portions, of the gate lines remote from portions to which voltage is first supplied, become lower than the required voltage since the gate lines have line resistance. Accordingly, the memory device needs means to compensate for a drop in voltage in the middle portions of the gate lines. However, as the elements incorporated into a semiconductor device are integrated to a higher degree, a wiring width as well as a distance between cells becomes less and less, thereby increasing line resistance. In order to maintain voltage at all portions of the gate lines at a given level and to prevent an increased delay of the gate signal due to increased line resistance, means for restoring voltage are required. However, in most means for restoring voltage, a peripheral structure in the memory device is complicated, causing a loss of integration density. To reduce these problems, there have been proposed methods of increasing conductivity, such as forming silicon wiring of the gate lines by using a multi-layered silicon layer including a metal layer, or forming a metal silicide layer on an upper surface of each gate line as in a general flash memory device shown in FIG. 1 to FIG. 3

FIG. 1 is a top plan view showing a potion of a cell area of a general NAND type flash memory.

Referring now to FIG. 1, an isolation layer is formed on a substrate to form an active region 22 in a cell area. The active region 22 comprises a plurality of line shaped sub-regions which are defined respectively by a plurality of elongated openings or gaps of the isolation layer 23 shown in FIG. 2. In a center portion of the cell area, a common source line 45 is disposed to cross the active region 22. In each of upper and lower portions of the cell area divided by the common source line 45, a plurality of gate lines comprising a ground select gate line 33g, a plurality of, for example 8, 16, or 32 word lines WP, and a string select gate line 33s are formed in order from one of both sides of the common source line 45. Namely, two equal parts of gate lines formed in the upper and lower portion of the cell area are disposed symmetrically with respect to the common source line 45. Thus, the common source line 45 is disposed between two ground select gate lines 33g. Contacts 51, which are connected with bit lines 55, are formed in upper and lower end portions of the cell area forming drain regions of the string select gate lines 33s.

FIG. 2 shows a cross-section taken along line I—I in FIG. 1 and FIG. 3 shows a cross-section taken along line II—II in FIG. 1.

Referring to FIG. 2, the common source line 45 is formed on the substrate in contact a portion of the active region forming common source regions 35s' of the ground select gate lines 33g (shown in FIG. 1) and a portion of the isolation layer 23 therebetween. The bit lines 55 are disposed above the common source line 45 on an interlayer insulating layer 49.

Referring to FIG. 3, the active region 22 is not shown upward and downward as in FIG. 1, but leftward and rightward. On the active region 22, the gate lines 33g, WP, 33s are formed to cross the active region 22. The common source line 45 is in contact with the common source regions 35s' between two ground select gate lines 33g.

In a process of forming a cell area of a flash memory device shown in FIG. 1 to FIG. 3, first an isolation insulating layer 23 is formed on a substrate 20 to define an active region by means of a general shallow trench isolation (STI) process. The active region comprises a plurality of line shaped sub-regions. Thereafter, a gate insulating layer 24 is formed in the active region. Then, a plurality of gate lines comprising string select gate lines 33s, a plurality of word lines WP, and ground select gate lines 33g are formed to cross the active region. Also, source/drain regions 35', are formed to be overlapped with a plurality of line shaped sub-regions of the active region by doping an impurity on exposed surface of the substrate between the gate lines. The source/drain regions 35', formed by general ion implantation processes of using the gate lines and spacer 37 on both side walls of the gate lines as a mask, form a dual doped structure. Namely, highly doped portions are formed in the active region of the substrate between the adjacent spacers 37, and lightly doped portions in the active region of the substrate between the gate lines and the highly doped portions, i.e., in the active region of the substrate under the spacers 37. Then, an interlayer insulating layer 41 is deposited and planarized. Thereafter, a groove is formed to expose the common source regions 35s' between the ground select gate lines 33g and filled with a conductor such as a polysilicon layer to form a common source line 45. Then, after an interlayer insulating layer 49 is formed over the resultant substrate, contact holes are formed to expose drain regions 35d' of the string select gate lines 33s, and are then filled with a conductive layer to form bit line contacts. And then, bit lines are formed.

In order to decrease line resistance of the gate lines, a metal silicide layer containing metal such as cobalt (Co) or titanium (Ti) can be formed on upper portions of the gate lines as shown in black in FIG. 3. At this time, the metal silicide layer is also formed on the substrate in the source/drain regions 35'. Therefore, break down is possible due to voltage in transistor channels between the source/drain regions under the gate lines, since in a high integrated NAND type flash memory device, width of the gate lines and distance between the gate lines are very minute, for example below 0.15 μm. Particularly, in case the source/drain regions are highly doped, the transistor channels are more apt to break down since in a subsequent annealing process, the doped area is more diffused, so that the length of the transistor channels is not maintained at a proper level. In this case, a leakage of current into the substrate may also occur. Therefore, the higher the integrated degree of the elements in the memory device is, the lighter the source/drain regions have to be doped. Also, in case the silicide layer is formed in the source/drain regions, conductivity of the source/drain regions is increased, so that problems such as the break down and the current leakage become more intensified.

SUMMARY OF THE INVENTION

It is an object of the present invention to provide an improved semiconductor device and method of manufacturing the same, which can prevent a drop in voltage and an increased delay of gate signal due to increase of line resistance of gate lines.

It is another object of the present invention to provide an improved semiconductor device and method of manufacturing the same, which can maintain an impurity concentration or conductivity of source/drain regions in a substrate at a low level, thereby preventing break down in transistor channels and current leakage from occurring.

It is other object of the present invention to provide an improved semiconductor device and method of manufacturing the same, in which a metal silicide layer is not formed in source/drain regions, but on gate lines.

It is other object of the present invention to provide an improved semiconductor device and method of manufacturing the same, which can prevent break down in channels and current leakage of source/drain regions from occurring, when width of gate line having a metal silicide layer is below 0.15 µm.

These and other objects are provided, according to the present invention, by a semiconductor device comprising a plurality of gate lines composed of line shapes to function as gate electrodes in a plurality of transistors and separated from a semiconductor layer by a gate insulating layer, each having an upper metal silicide layer; and a plurality of source/drain regions formed on the semiconductor layer between said gate lines solely by carrying out impurity implantation processes.

In the semiconductor device of the invention, the semiconductor layer is formed of a silicon substrate. Also, the impurity implantation is carried out by a dose of impurity below $1.0 \times 10^{15}$ ions/cm$^2$ to prevent break down from occurring in channels of the device, for example the device in which width of the gate line is below 0.15 µm.

A method of manufacturing a semiconductor device comprises the steps of forming a gate insulating layer on a semiconductor substrate, forming a silicon gate layer on the gate insulating layer, forming gate lines by patterning the silicon gate layer, performing an impurity implantation by using the gate lines as a mask to form a MOS transistor structure, forming an interlayer insulating layer over the whole surface of the substrate over which the MOS transistor structure are formed, exposing the silicon gate layer of the gate lines by planarizing the interlayer insulating layer, and forming a metal silicide layer on an exposed surface of the silicon gate layer. In the method of the present invention, metal for forming the metal silicide layer uses Co or Ti. In forming of the metal silicide layer, non-reacted residual metal is removed by an etching process. The metal silicide layer is not formed in source/drain regions, but on upper portions of the gate lines.

The method of the present invention further includes the steps of forming openings such as grooves to expose a given region of the substrate by partially etching the interlayer insulating layer after the step of forming the interlayer insulating layer, and filling the openings by depositing a silicon layer acting as a wire. In the step of exposing the silicon gate layer of the gate lines, the silicon layer in the openings is also planarized.

DETAILED DESCRIPTION OF PREFERRED EMBODIMENTS

The present invention now will be described more fully hereinafter with reference to the accompanying drawings, in which a preferred embodiment of the invention is shown. This invention may, however, be embodied in many different forms and should not be construed as limited to the embodiment set forth herein. Rather, this embodiment is provided so that this disclosure will be thorough and complete, and will fully covey the scope of the invention to those skilled in the art. Like numbers refer to like elements throughout.

Figure 1:
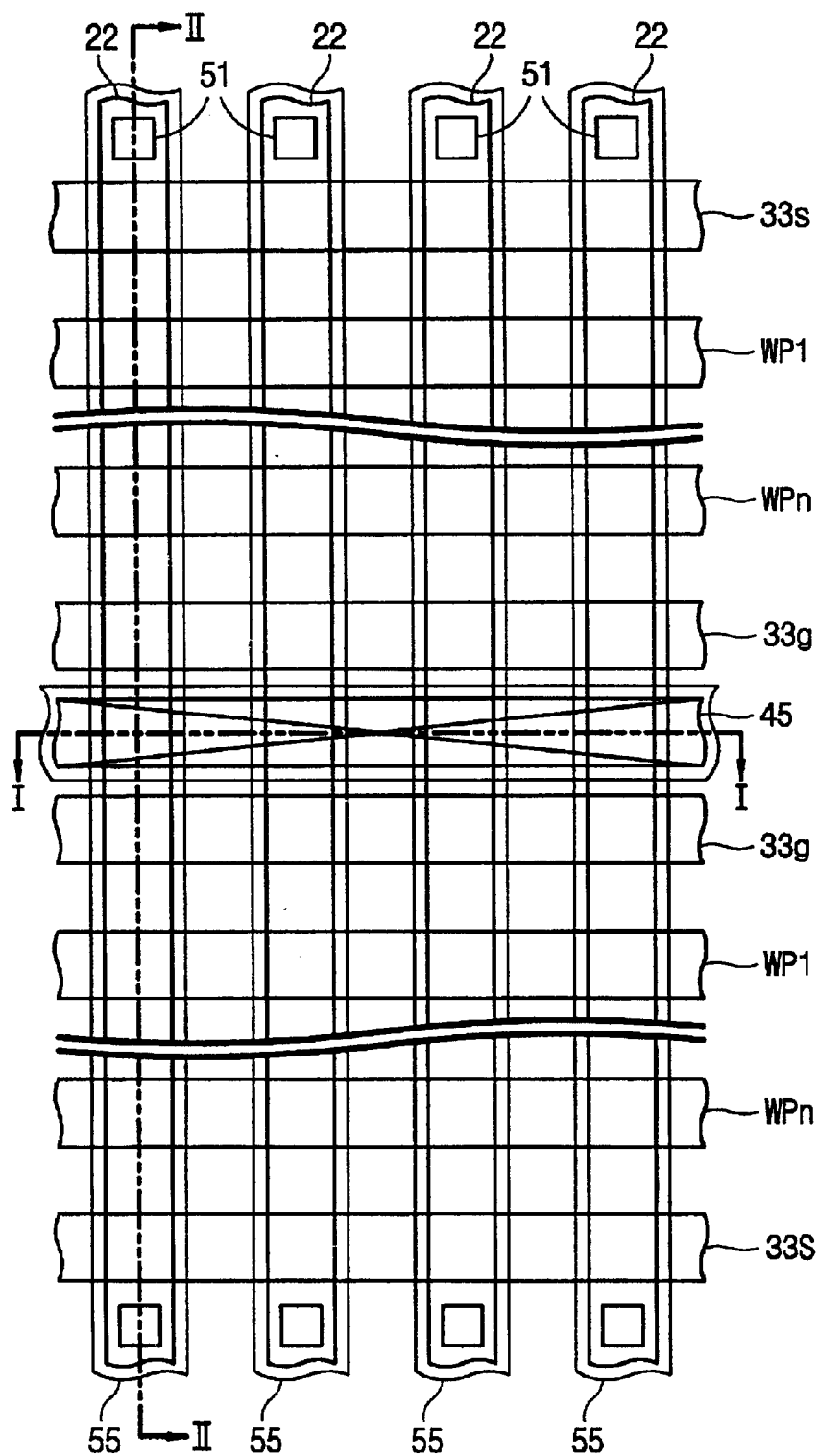
FIG. 1 is a top plan view showing a portion of a cell area of a general NAND type flash memory.
Figure 2:
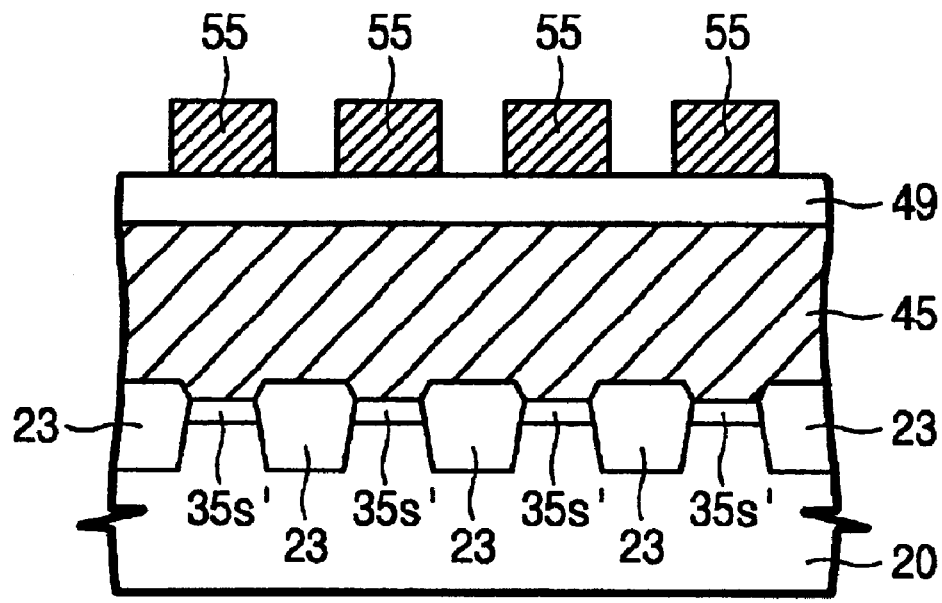
FIG. 2 is a cross-sectional view taken along line I—I in FIG. 1.
Figure 3:
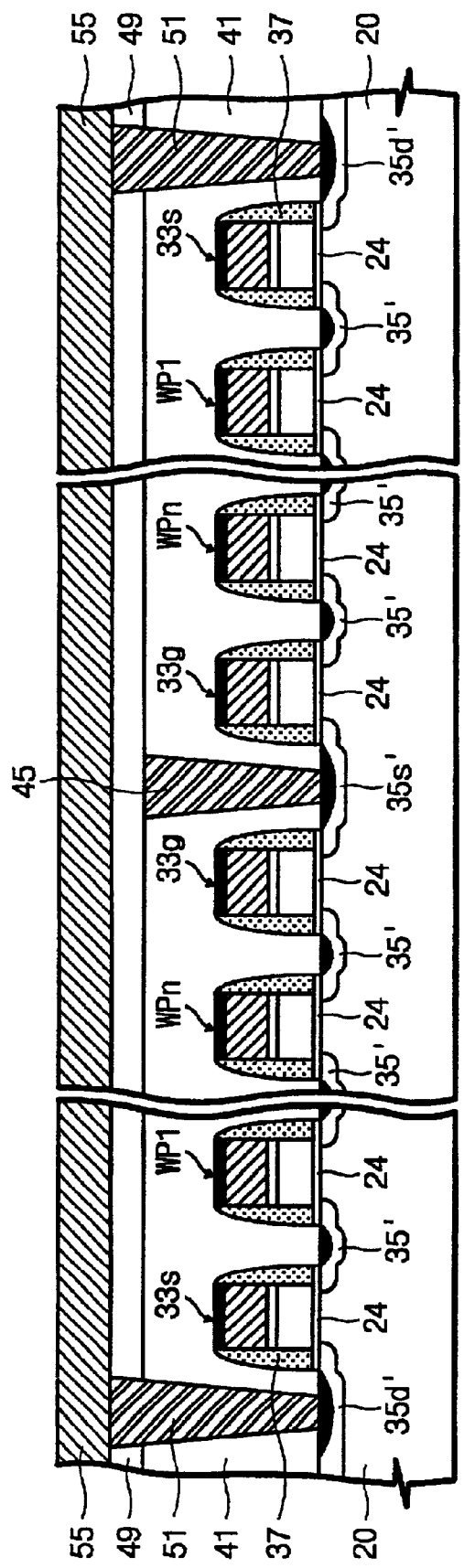
FIG. 3 is a cross-sectional view taken along line II—II in FIG. 1.
Figure 4:
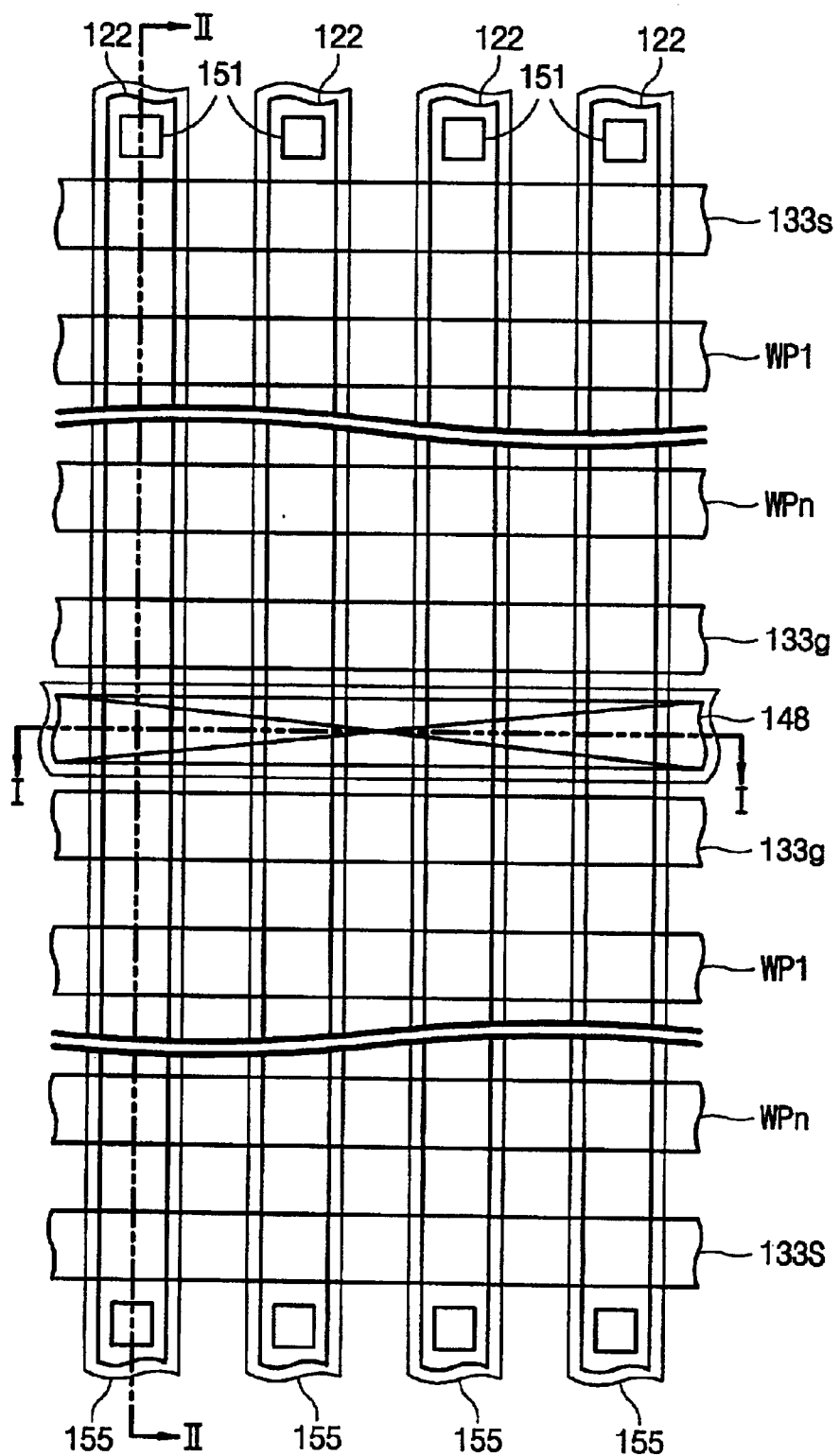
FIG. 4 is a top plan view showing a potion of a cell area of a NAND type flash memory device in accordance with one embodiment of the present invention
Figure 5:
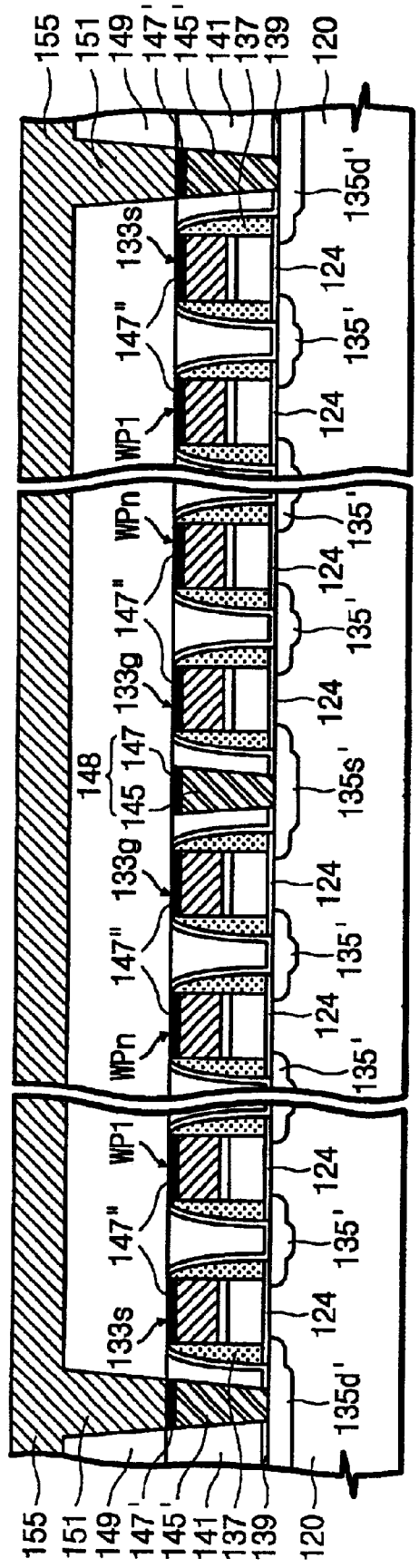
FIG. 5 is a cross-sectional view taken along line II—II of FIG. 4.

FIG. 4 is a top plan view showing a portion of a cell area of a NAND type flash memory device in accordance with one embodiment of the present invention and FIG. 5 is a cross-sectional view taken along line II—II of FIG. 4.

Referring now to FIG. 4 and FIG. 5, the flash memory device of the present invention has an active region 122 formed on a substrate in a cell area by an isolation layer. The active region comprises a plurality of line shaped sub-regions which are defined respectively by a plurality of elongated openings or gaps of the isolation layer. In a center portion of the cell area, a common source line 148 is disposed to cross the active region 122. The common source line 148 has a wall shaped body 145 formed of silicon, and an upper metal silicide layer 147. A plurality of gate lines 133g, WP, 133s are formed parallel to the common source line 148 and symmetrically with respect to the common source line 148 in upper and lower portions of the cell area which are divided by the common source line 148.

In a general NOR type flash memory device, gate lines can be formed in pairs, each being disposed adjacent to each of both sides of a common source line, i.e., between a common source line and bit line contact regions. However, in the NAND type flash memory device of the present invention, a half of gate lines comprising a ground select gate line 133g, a plurality of word lines WP, and a string select gate line 133s are formed in order upward or downward from the common source line 148, i.e., in each of the upper and lower portions of the cell area which are divided by the common source line 148. Namely, one half of gate lines formed upwardly from the common source line 148 is symmetric with the other half of gate lines formed downwardly from the common source line 148. Among the gate lines, at least word lines WP have silicon layer for control gates having upper metal silicide layer.

On junction regions in which the word lines among the gate lines are crossed with the line shaped sub-regions of the active regions 122, the gate lines form gate electrodes of cell transistors. Each of the gate electrodes formed on the junction regions has a general double-layered gate structure of a nonvolatile memory transistor. The double-layered gate structure is composed of a floating gate, a dielectric layer, and a control gate formed in order on a gate insulating layer 124 separating the gate electrodes from the active regions 122. Adjacent transistors on same word lines WP are not connected through a floating gate layer, but a control gate layer.

Source/drain regions 135' are formed by doping an impurity against an exposed portion of the substrate between the gate lines. Accordingly, in adjacent cell transistors formed in one of the line shaped subregions of the active regions, respective source and drain regions overlap each other.

On the junction regions, the ground select gate lines 133g and the string select gate lines 133s do not need to have a double-layered gate structure having the floating gate and the control gate. Accordingly, these gate lines can be composed of line shaped structures formed using only a floating gate layer, making a control gate layer in a dummy pattern, or connecting electrically a control gate layer with a floating gate layer through butting contacts.

Insulating spacers 137 are generally formed on both side walls of the gate lines. In the source/drain regions 135', a general dual doped structure can be formed by using the gate lines and the insulating spacers 137 as a mask. Namely, highly doped portions are formed in the active region of the substrate between the adjacent insulating spacers 137 between the gate lines, and lightly doped portions in the active region of the substrate between the gate lines and the highly doped portions, i.e., in the active region of the substrate under the insulating spacers 137. However, in the ion implantation for the highly doped portions, a concentration, i.e., a dose of impurity is restrained below $1.0 \times 10^{15}$ ions/cm$^2$ to prevent channels under the gate lines from being broken down when width of the gate lines, i.e., length of the channels is below 0.15 μm. Preferably, a supplementary insulating layer 139 is formed on the gate lines on which the insulating spacers 137 are formed.

An interlayer insulating layer is formed over the whole surface of the substrate to cover the gate lines and the common source lines 148. The interlayer insulating layer is composed of upper and lower layers 149, 141. The lower layer 141 of the interlayer insulating layer is formed at the same level as that of a metal silicide layer of the common source line 148 or the gate lines. Bit lines 155 formed parallel to the active region 122 are connected with drain regions 135d' of string select transistors on the string select gate lines 133s, through bit line contacts 151, silicon pads 145' and metal silicide layers 147'. The common source line 148 is connected with common source regions 135s' of two ground select transistors formed on a portion of the substrate on which the active region 122 is overlapped with two ground select gate lines 133g.

A method of manufacturing a NAND type flash memory device of the present invention shown in FIG. 5 will now be described with reference to FIG. 6 to FIG. 10. First, an isolation layer 123 is formed on a substrate 120 in a cell area to form an active region as shown in FIG. 6b. The active region comprises a plurality of line shaped sub-regions which are defined respectively by a plurality of elongated openings or gaps of the isolation layer. The isolation layer 123 is formed by a shallow trench isolation (STI) process. However, in case of using a self-aligned STI process, a portion of a gate insulating layer and a floating gate silicon layer can be deposited before forming of the isolation layer 123. In the cell area, the isolation layer 123 and the active region 122 are disposed to alternate with each other.

Figure 6A:
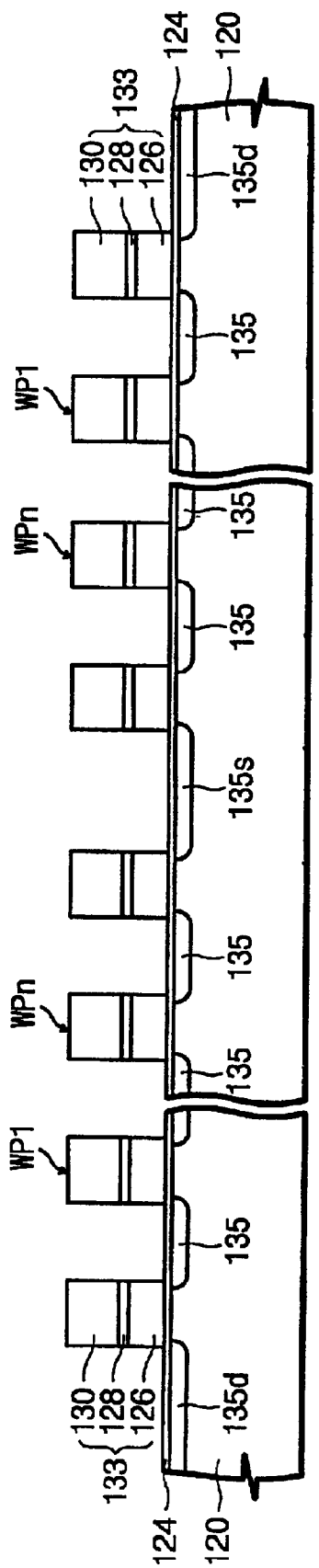
FIG. 6 to FIG. 10 are flow diagrams showing the process steps of a method of manufacturing the cell area of the NAND type flash memory device shown in FIG. 5.
Figure 6B:
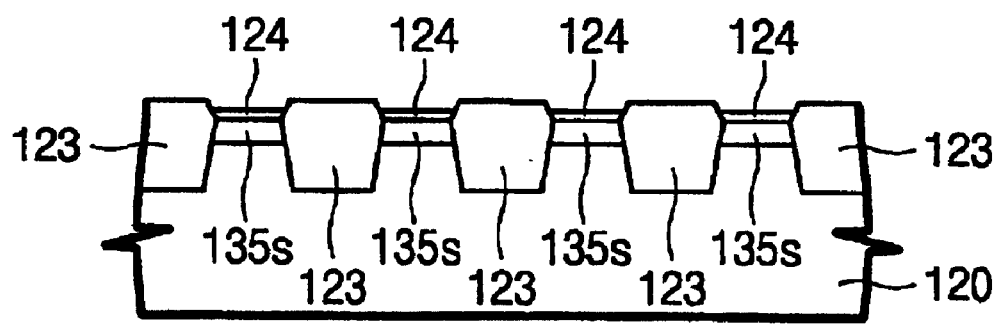

Referring to FIG. 6a, a thin gate insulating layer 124 is formed on the active region 122 of the substrate 120 on which the isolation layer 123 is formed. On the gate insulating layer 124, a silicon floating gate layer is formed and patterned to form a floating gate intermediate pattern. At this time, a portion of the silicon floating gate layer overlapped parallel to the active region 122 is remained, whereas a portion of the silicon floating gate layer on the isolation layer 123 of the rest except a region on which the ground select lines or the string select lines is to be formed is removed, so that it forms a continuous line shaped pattern crossing with the active region 122.

Thereafter, a separating dielectric layer and a silicon control gate layer are formed over the whole surface of the substrate 120 over which the floating gate intermediate pattern is formed. The separating dielectric layer generally uses an oxide nitride oxide (ONO) layer. The silicon control gate layer uses a doped polysilicon layer to increase conductivity. Then, a plurality of required gate lines are formed in a direction vertical to a direction which the active region is formed, by etching partially the silicon control gate layer, the dielectric layer, and the intermediate pattern. At this time, each of gate electrodes 133 on conjunction portions which the gate lines are crossed with the active region is formed to have a layered structure composed of a floating gate pattern 126, a dielectric layer pattern 128 and a silicon control gate layer pattern 130.

The gate insulating layer 124 is patterned or remained as a buffer layer for ion implantation. Thus, two equal parts of gate lines, each being composed of a ground select gate line 133g, a plurality of word lines WP, and a string select gate line 133s, are formed upwardly and downwardly from the center of the cell area, respectively. Namely, a half of gate lines formed upwardly from the center of the cell area are symmetric with the other half of gate lines formed downwardly from the center of the cell area. At this time, the thin gate insulating layer 124 covering the active region 122 of the substrate 120 between the gate lines is exposed. The substrate 120 in exposed active region is lightly implanted to form low concentration impurity regions 135. In the ion implantation, the gate lines act as an ion implantation mask.

Referring to FIG. 6b, a region on which a common source line is to be formed is maintained in a state which the silicon control gate layer, the dielectric layer, and the floating gate intermediate pattern are removed from the substrate 120 by means of the gate line patterning process, so that the isolation layer 123 and common source regions 135s' forming a portion of the low concentration impurity regions 135 are disposed to be alternated each other. Also, in the region, there are no layers except the gate insulating layer 124.

Figure 7:
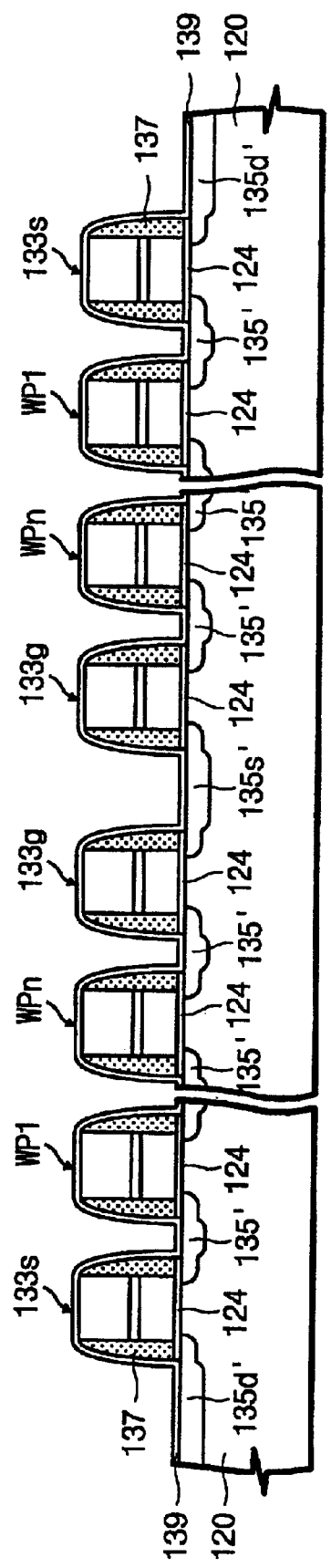

Referring to FIG. 7, after the ion implantation, a plurality of insulating spacers 137, each being composed of a nitride layer or an oxide layer, are formed on side walls of the gate electrodes 133. The spacers 137 are formed by using a method of depositing an insulating layer over the substrate 120 over which the gate electrodes 133 are formed, and etching anisotropically the whole surface of the substrate 120 over which the insulating layer are formed. After forming the spacers 137, a relatively high concentration impurity implantation is carried out by using the gate lines and the spacers 137 as a mask. At this time, an impurity concentration is restrained to prevent break down in transistor channels under the gate lines from being occurred. Thus, source/drain regions 135' having dual doped structures are formed and a MOS transistor structure is obtained. For a sequent process, an etch stop layer 139 is formed of a silicon nitride layer having a thickness of 1,000 Å over the whole surface of the substrate 120.

Figure 8A:
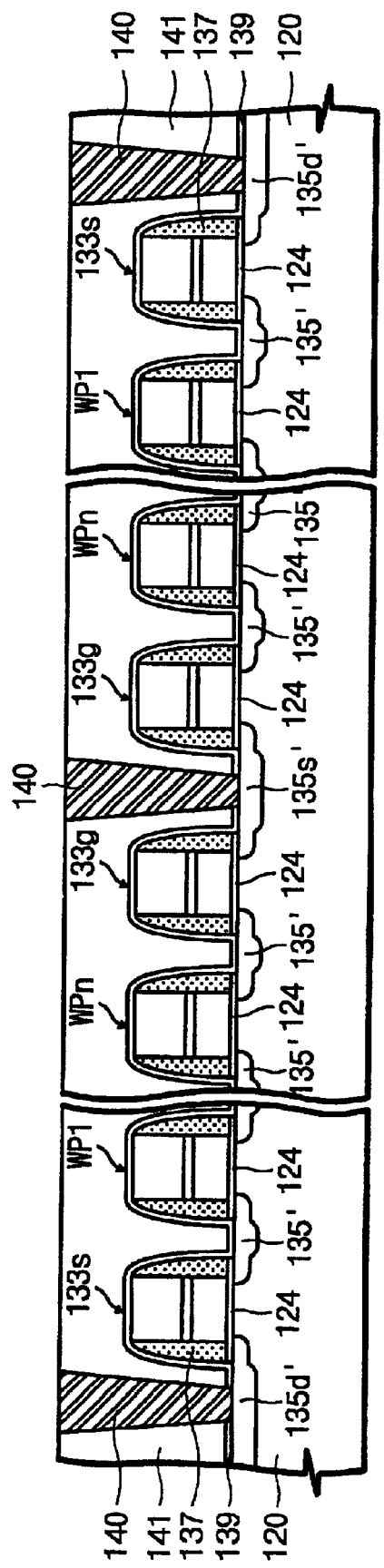

Referring to FIG. 8a, an interlayer insulating layer 141 is formed over the whole surface of the substrate 120 having the MOS transistor structure on which the gate electrodes 133 and the source/drain regions 135' are formed. The interlayer insulating layer 141 is deposited to a thickness enough to fill gaps or openings between the gate lines and then planarized. Thereafter, a groove is formed in the interlayer insulating layer 141 to expose common source regions 135s' in the active region between two ground select lines 133g formed parallel to each other on the center of the cell area. At this time, the etch stop layer 139 on the exposed portion of the common source region on which a groove is formed is also etched and removed. Also, in order to form pads for bit line contacts, contact holes can be formed on drain regions 135d' of one side of each string select gate line 133s. Then, a silicon layer 140, for example a doped polysilicon layer is deposited over the whole surface of the substrate 120 to fill the groove and contact holes. Thereafter, the silicon layer 140 is planarized to expose the interlayer insulating layer 141.

Figure 8B:
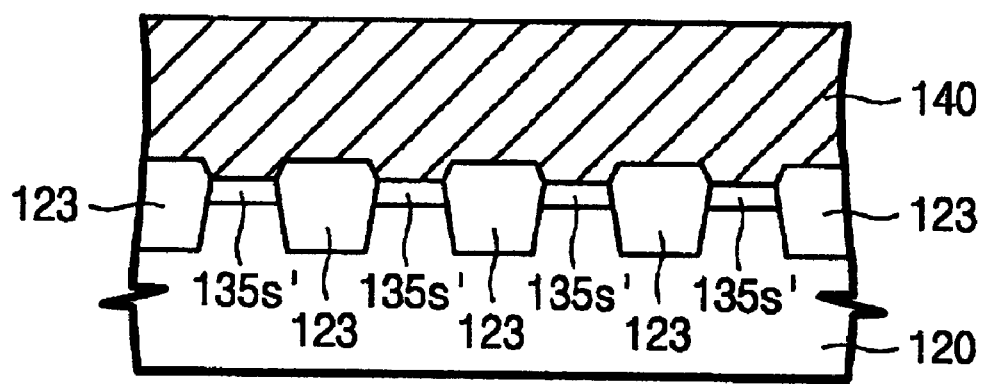

Referring to FIG. 8b, with filling the groove with the silicon layer 140, unfinished silicon wall of the common source line which is in contact with the common source region 135s' crossing with the active region is obtained.

Figure 9A:
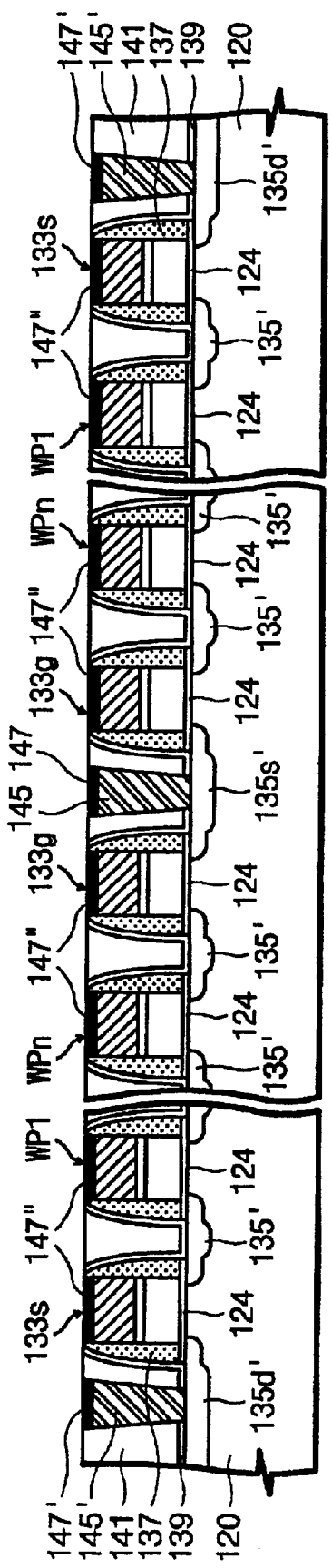
Figure 9B:
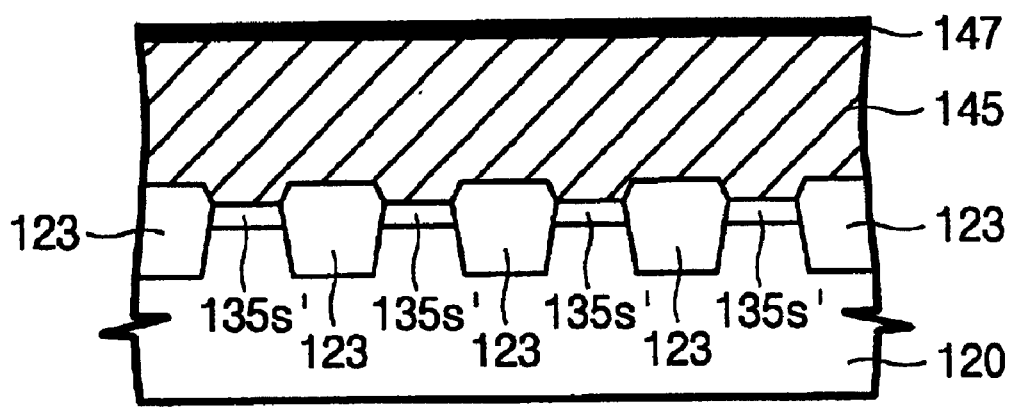

Referring to FIG. 9a and FIG. 9b, upper portions of the interlayer insulating layer 141 and the silicon layer 140 filling the groove shown in FIG. 8a and FIG. 8b are removed by carrying out a planarization etching process, and thereby the control gate layer pattern 130 of the gate lines is exposed. Accordingly, silicon pads 145' for bit line contacts and a silicon wall 145 of the common source line extended at a given depth parallel to the gate lines are formed from the silicon layer 140. On exposed silicon surfaces, i.e., upper surfaces of the silicon wall 145 of the common source line, the silicon pads 145' for bit line contacts and the control gate layer pattern 130 of the gate lines, metal silicide layers 147, 147', 147'' are formed to decrease line resistance.

Metal material for forming the metal silicide layers 147, 147', 147'' uses one selected from cobalt (Co) and titanium (Ti). For example, in case of using Co, first, a Co layer is formed to a thickness of 100 Å to 500 Å by a sputtering process. Then, a first rapid thermal annealing (RTA) process is carried out at a temperature of about 450° C. to form a layer of Co silicide such as $Co_2Si$. Unsilicified Co metal is removed from the substrate by a selective etching process. Thereafter, a second RTA process is carried out at a high temperature of about 850° C., so that a superior Co silicide layer in properties is formed.

Thus, the metal silicide layer 147 of the common source line is formed at the same level or height as that of the metal silicide layers 147'' of the gate lines. Therefore, in the flash memory device of the present invention, there is an advantage that step coverage in a sequent process is reduced compared with that of a conventional flash memory device which an upper surface of the common source line is formed at a height higher than that of upper surfaces of the gate lines. Also, the invention has an advantage that conductivity of the common source line is improved since it has the upper metal silicide layer. Also, in case of forming a high integrated flash memory in which width of the gate lines is very small, the present invention can prevent a leakage of current into the substrate or break down in channels from being occurred.

Figure 10:
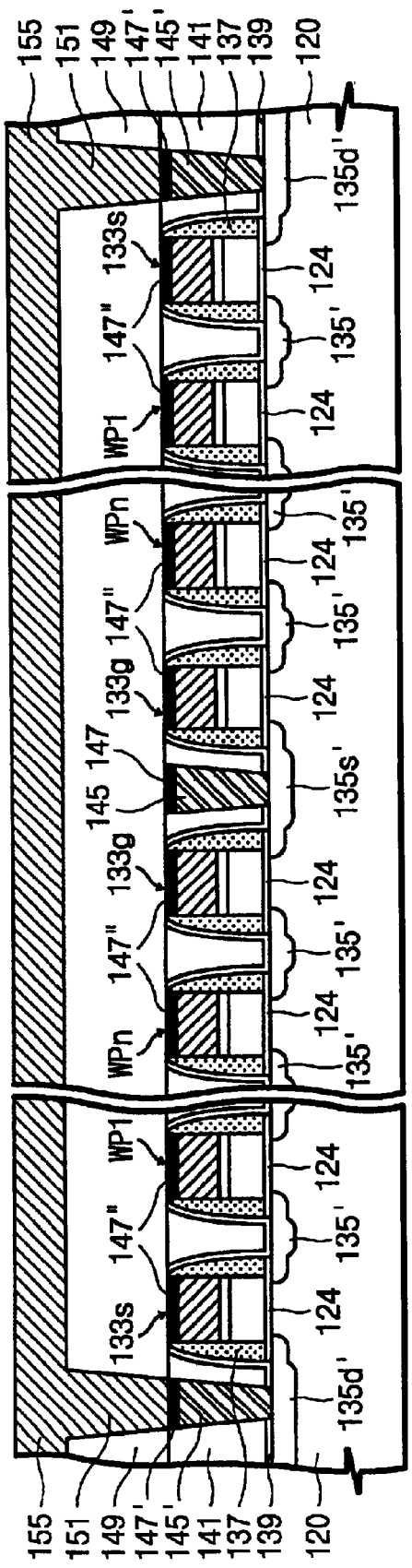

Referring to FIG. 10, after forming of the metal silicide layers 147, 147', 147'', an interlayer insulating layer 149 is deposited and then patterned to form bit line contact holes. At this time, since the common source line along with the pads 145' for bit line contacts 151 was formed at same level or height, depth of the contact holes can be decreased compared with that of the conventional flash memory device, so that the process time, cost and error in the fabrication can be reduced. Thereafter, a conductive layer is deposited and patterned, so that bit line contacts 151 and bit lines 155 are formed. In case the bit lines are formed of metal, the metal silicide layers 147' can assist to form ohmic contacts between the silicon pads 145' and the bit line contacts 151.

As apparent from the foregoing description, it can be appreciated that the present invention provides a semiconductor device and method of manufacturing the same which can restrain break down in transistor channels and increase of current leakage due to increase of conductivity of source/drain regions from being occurred, by preventing a metal silicide layer from being formed on the substrate between gate lines when forming the metal silicide layer on upper surfaces of the gate lines to increase conductivity.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A semiconductor device comprising:
    a plurality of gate lines composed of line shapes to function as gate electrodes in a plurality of transistors and separated from a semiconductor layer by a gate insulating layer, each gate line having an upper metal silicide layer;
    a plurality of source/drain regions formed on said semiconductor layer between said gate lines solely by carrying out impurity implantation processes.

2. The semiconductor device according to claim 1, wherein said semiconductor layer is formed of a silicon substrate.

3. The semiconductor device according to claim 1, wherein said impurity implantation processes are carried out by a dose of impurity below $1.0 \times 10^{15}$ ions/cm$^2$.

4. The semiconductor device according to claim 1, wherein said metal of said metal silicide layer is one selected from the group consisting of Co and Ti.

5. A flash memory device comprising:
    an active region comprising a plurality of line shaped sub-regions, each being formed parallel to each other by means of an isolation layer on a substrate in a cell area;
    at least one common source line formed of wall shaped silicon material to be in contact with and cross said active region, having an upper metal silicide layer; a plurality of gate lines formed parallel to said common source line, arranged in order from both sides of said common source line to be symmetric with respect to said common source line and separated from said active region by said gate insulating layer, each having an upper metal silicide layer;
    a plurality of source/drain regions formed in said active region between said gate lines by carrying out impurity implantation;
    an interlayer insulating layer formed to cover said gate lines and said common source line;
    a plurality of bit lines formed parallel to said active region and connected with at least one of both sides of said gate lines positioned in both ends of said active region through contacts passing through said interlayer insulating layer; and at least a portion of said gate lines having a layered structure comprising a floating gate of a silicon layer, a separating dielectric layer, and a control gate having a silicon layer and a silicide layer, on each of junction regions on which said gate lines and said active regions cross each other.

6. The flash memory device according to claim 5, wherein said metal silicide layer of said common source line is formed of the same material and level as those of said metal silicide layers of said gate lines.

7. The flash memory device according to claim 5, wherein a half of said gate lines arranged symmetrically with respect to said common source line is composed of a ground select gate line, a plurality of word lines and a string select gate line arranged in order from one of both sides of said common source line; and wherein on a portion of said junction regions which said word lines among said gate lines are crossed with said active region, a double-layered gate structure in which a floating gate is separated from a control gate by a dielectric layer is formed.

8. The flash memory device according to claim 5, wherein said source/drain regions are composed of regions doped by a dose of impurity below $10 \times 10^{15}$ ions/cm$^2$.

9. The flash memory device according to claim 5, wherein each of said contacts is composed of:

a silicon pad baying a metal silicide layer formed at the same level as that of said metal silicide layers of said gate lines and said common source line; and an upper portion composed of the same material as that of said bit lines.

10. The flash memory device according to claim 9, wherein said bit lines are composed of the same metal material as that for forming said metal silicide layers.

11. The flash memory device according to claim 5, wherein said gate lines have insulating spacers formed on both side walls thereof, and each of said source/drain regions between said gate lines have a dual doped structure.

* * * * *

UNITED STATES PATENT AND TRADEMARK OFFICE
CERTIFICATE OF CORRECTION

PATENT NO. : 6,720,579 B2
DATED : April 13, 2004
INVENTOR(S) : Shin et al.

It is certified that error appears in the above-identified patent and that said Letters Patent is hereby corrected as shown below:

<u>Column 10,</u>
Line 3, below "$10 \times 10^{15}$ ions/cm$^2$," should read -- below $1.0 \times 10^{15}$ ions/cm$^2$. --.
Line 6, "pad baying a metal" should read -- pad having a metal --.

Signed and Sealed this

Seventh Day of December, 2004

JON W. DUDAS
*Director of the United States Patent and Trademark Office*